United States Patent [19]
Dunn et al.

[11] Patent Number: 6,096,618
[45] Date of Patent: *Aug. 1, 2000

[54] METHOD OF MAKING A SCHOTTKY DIODE WITH SUB-MINIMUM GUARD RING

[75] Inventors: James S. Dunn, Jericho; Stephen A. St. Onge, Essex Junction, both of Vt.

[73] Assignee: International Business Machines Corporation, Armonk, N.Y.

[*] Notice: This patent is subject to a terminal disclaimer.

[21] Appl. No.: 09/009,087

[22] Filed: Jan. 20, 1998

[51] Int. Cl.$^7$ .............................................. H01L 21/8222
[52] U.S. Cl. .......................... 438/328; 438/353; 438/942; 257/409
[58] Field of Search ..................................... 257/481, 497, 257/471, 409; 438/149, 570, 926, 353, 696, 440, 328; 430/312

[56] References Cited

U.S. PATENT DOCUMENTS

| | | | |
|---|---|---|---|
| 3,820,235 | 6/1974 | Goldman | 438/492 |
| 4,228,448 | 10/1980 | Lalumia et al. | 257/474 |
| 4,333,794 | 6/1982 | Beyer et al. | 438/427 |
| 4,767,723 | 8/1988 | Hinsberg et al. | 438/926 |
| 4,868,135 | 9/1989 | Ogura et al. | 438/203 |
| 5,027,183 | 6/1991 | Dreps | 257/544 |
| 5,087,579 | 2/1992 | Tomassetti | 438/208 |
| 5,206,182 | 4/1993 | Freeman | 438/203 |
| 5,382,824 | 1/1995 | Popovic | 257/464 |
| 5,496,745 | 3/1996 | Ryum et al. | 438/359 |
| 5,580,798 | 12/1996 | Grubisich | 438/358 |
| 5,656,414 | 8/1997 | Chou et al. | 430/312 |
| 5,696,025 | 12/1997 | Violette et al. | 438/570 |
| 5,882,977 | 3/1999 | Dunn et al. | 438/353 |
| 5,916,821 | 6/1999 | Kerber | 438/696 |

*Primary Examiner*—Wael Fahmy
*Assistant Examiner*—William David Coleman
*Attorney, Agent, or Firm*—DeLio & Peterson, LLC; Robert Curcio; Eugene I. Shkurko

[57] ABSTRACT

The invention is a method of fabricating a self-aligned, sub-minimum guard ring for a Schottky diode device wherein the sub-minimum guard ring is positioned at the inside edges of adjacent isolation structures and is self-aligned to the intrinsic base implanted regions. In this particular invention, illustrating the guard ring fabrication technique, an improved Schottky diode is fabricated at minimum groundrules which utilizes a frequency-doubling resist and an appropriate mask to provide the implant mask for a p- or n-type guard ring. This shallow implant near the surface prepares a guard ring that minimizes the electric field at the interface where the deposited metal or silicide joins the STI structure. Additional ion implants with energies greater than and less than the guard ring implantation energy may be deposited to tailor the substrate surface and reduce the parasitic capacitance of the diode.

29 Claims, 10 Drawing Sheets

METHOD OF MAKING A SCHOTTKY DIODE WITH SUB-MINIMUM GUARD RING

BACKGROUND OF THE INVENTION

1. Field of the Invention

The present invention relates to the fabrication of semiconductor devices and integrated circuits, and more particularly to a structure and method for fabricating a self-aligned, sub-minimum guard ring for a Schottky Diode.

2. Description of Related Art

Schottky diodes are prone to high electric field regions at the corner of the ion implant regions where the metal or silicide of the diode structure meets the isolation structure. Typically, this electric field prohibits the diode from performing at its optimum characteristic level. Parameters that are adversely affected by this field include the reverse bias leakage current and breakdown voltage.

The use of a Schottky diode generally allows integrated circuits to have greater speed because it is a majority carrier device. Having a low carrier lifetime attributes to its greater switching speeds. Additionally, this type of diode requires a smaller voltage signal for switching. A typical application of a Schottky diode is as an anti-saturation diode clamp.

Current approaches at eliminating the high electric field regions near the isolation barriers consist of adding a guard ring at the edge of the isolation structure. In the case of an n-type Schottky, the guard rings are added at the n-regions around the Schottky contact region. This provides for a better diode; however, it results in parasitic capacitance and slower device operation. It also enlarges the device considerably due to the need for a second mask and the tolerances associated with additional processing.

Bearing in mind the problems and deficiencies of the prior art, it is therefore an object of the present invention to fabricate an improved low-leakage Schottky diode with a guard ring that minimizes the electric field and leakage current generated at the perimeter of the deposited metal or silicide layer that forms the Schottky contact.

It is another object of this invention to provide a method that minimizes the size of the guard ring thereby enhancing the device cell density and reducing the parasitic capacitance.

It is a further object of this invention to eliminate the need for an additional mask in the fabrication of the guard rings thereby reducing the associated stack up of tolerance errors in the fabrication process.

It is yet another object of this invention to deposit ion implant regions within the substrate at a depth level near the top and bottom of the isolation structures to tailor the surface of the diode and reduce the series resistance.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for preparing a diode with a guard ring comprising the steps of: a) preparing a substrate having a surface thereof with adjacent isolation structures having inside edges on either side of an n- or p-type implanted region; b) applying a resist to the surface of the substrate; c) depositing an ion implant of type opposite to the implanted region in the substrate on both sides of the inside edges of the adjacent isolation structures to create a guard ring; d) removing the resist to expose the substrate between the inside edges of the adjacent isolation structures; and, e) applying a material to the exposed substrate between the isolation structures to prepare a diode device.

The method may be prepared using shallow trench isolation structures as the isolation barriers.

Additionally, a sacrificial pad layer may be formed on the surface of the substrate before applying the resist to the surface of the substrate. If a sacrificial pad is employed, the step of removing the resist would then comprise removing the sacrificial pad layer and the resist to expose the substrate between the inside edges of the adjacent isolation structures.

In another aspect, the step of applying a resist to the substrate and the step of implanting the guard ring, comprise the steps of: (i) applying a resist over the substrate; (ii) exposing and developing the resist so as to remove portions of the resist above both sides of the inside edges of the adjacent isolation structures; and, (iii) depositing an ion implant of type opposite to the implanted region in the substrate on both sides of the inside edges of the adjacent isolation structures to create a guard ring using remaining portions of the resist as a mask.

The step of applying material to the exposed substrate further comprises p- or n-type ion implantation at a depth approximately equal to depth of the guard ring, at a depth deeper than the depth of the guard ring, or both, at depths approximately equal to the guard ring and deeper than the guard ring.

In another aspect, the step of applying a resist over the substrate comprises applying a layer of dual tone resist; and, the step of exposing and developing the resist comprises exposing the dual tone resist using a mask such that: (iv) a portion of the resist between the adjacent isolation structures remains unexposed; (v) portions of the resist over the adjacent isolation structures outside the inside edges of the adjacent isolation structures are completely exposed; and, (vi) portions of the resist over both sides of the inside edges of the adjacent isolation structures are partially exposed; and, further comprises removing the partially exposed resist from the substrate.

This latter aspect further comprising the steps of: (vii) implanting a guard ring by forming a doped semiconductor region with an ion implant of type opposite the implanted region, over both sides of the inside edges of the isolation regions, using the remaining resist as a second mask for the implant; (viii) exposing and developing the unexposed portion of remaining resist regions from the substrate prepared during the exposing step (iv); and, (ix) preparing a second mask for implantation by removing the resist portion exposed and developed in step (viii), above.

In a further aspect of applying a resist to the substrate, a layer of dual tone resist is applied over the substrate; thus, the step of exposing and developing the resist then comprises exposing the dual tone resist using a mask such that: (x) using a pre-selected exposing light frequency, a portion of the resist a pre-selected distance between the adjacent isolation structures remains unexposed; (xi) using the pre-selected exposing light frequency, portions of the resist over the adjacent isolation structures a pre-selected distance outside the inside edges of the adjacent isolation structures are completely exposed; and, (xii) using the pre-selected exposing light frequency, portions of the resist a pre-selected distance over both sides of the inside edges of the adjacent isolation structures are partially exposed; and, further comprises removing the partially exposed resist from the substrate.

In the aspect of applying the dual tone resist, the method further comprises the steps of: (xiii) implanting a guard ring by forming a doped semiconductor region with an implant of type opposite the implanted region, over both sides of the inside edges of the isolation regions, using the remaining resist as a second mask for the implant; (xiv) exposing and developing the unexposed portion of remaining resist regions from the substrate during the exposing step (x); and, (xv) preparing a second mask for implantation by removing the resist portion exposed and developed in step (xiv), above.

A separate aspect of the invention provides for a method of preparing a guard ring on a semiconductor substrate comprising the steps of: a) preparing a substrate having a surface thereof with adjacent isolation structures having inside edges on either side of an n- or p-type implanted region; b) applying a dual tone resist to the substrate; c) exposing and developing the resist so as to remove portions of the resist above both sides of the inside edges of the adjacent isolation structures such that: i) a portion of the resist between the adjacent isolation structures remains unexposed; ii) portions of the resist over the adjacent isolation structures outside the inside edges of the adjacent isolation structures are completely exposed; and, iii) portions of the resist over both sides of the inside edges of the adjacent isolation structures are partially exposed; and, d) implanting a guard ring by forming a doped semiconductor region with an implant of type opposite the implanted region, over both sides of the inside edges of the isolation regions, using the remaining resist as a second mask for the implant.

The method of this aspect may be prepared using shallow trench isolation structures as the isolation barriers.

Additionally, a sacrificial pad layer may be formed on the surface of the substrate before applying the resist to the surface of the substrate.

Also, in applying material to the exposed substrate, this aspect further comprises p- or n-type ion implantation at a depth approximately equal to depth of the guard ring, at a depth deeper than the depth of the guard ring, or both, at depths approximately equal to the guard ring and deeper than the guard ring.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–7 of the drawings in which like numerals refer to like features of the invention. Features of the invention are not necessarily shown to scale in the drawings.

The invention is a method of fabricating a self-aligned, sub-minimum guard ring for a Schottky diode wherein the sub-minimum guard ring is positioned at the inside edges of adjacent isolation regions and is self-aligned to the Schottky contact region. In one embodiment of the present invention, illustrating the guard ring fabrication technique, an improved Schottky diode is fabricated at minimum groundrules which utilizes a dual tone (frequency-doubling) resist and an appropriate mask to provide the implant mask for a p-type guard ring within an n-type implant region of a p-type substrate. It should be noted that it is just as feasible to fabricate a Schottky diode of the present invention using an n-type guard ring within a p-type implant of an n-type substrate. The description herein shall refer to a p-type guard ring within an n-type implant region of a p-type substrate, however, either implementation is considered within the scope of this invention.

In general, a shallow implant near the surface prepares a guard ring that minimizes the electric field and leakage current at the edge of the Schottky diode contact region where the deposited metal or silicide abuts the isolation structure.

Figure 1:
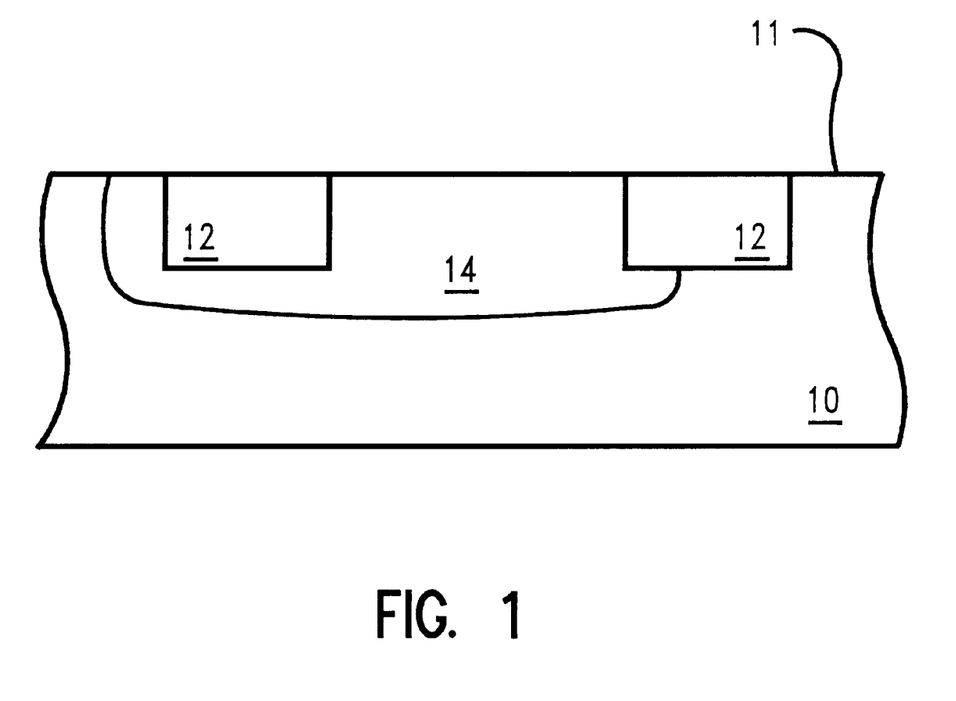
FIG. 1 depicts a cross-sectional view of a silicon substrate prepared with an n-implanted region and shallow trench isolation structures.

First, as shown in FIG. 1, a p-type silicon substrate 10 with surface 11 is prepared with n-implanted region 14 and shallow trench isolation (STI) structures 12. The implanted regions may be formed by any known process such as impurity implantation and diffusion. The STI structures are established by cutting into the substrate and any other layers deposited on the substrate's surface, and depositing recessed oxide (ROX) for isolation. Although STI structures are shown, other isolation structures may be used with the present invention. The starting p-type substrate is preferably made of silicon monocrystalline semiconductor material which is formed by conventional wafer fabrication techniques.

The STI structures 12 are etched within the substrate and filled with a dielectric to create isolation barriers. These isolation structures surround and define the area where a semiconductor device is to be constructed, and provide some isolation between that area and adjacent regions to be used for the formation of additional semiconductor devices. However, the edge of the Schottky diode, fabricated with either a metal or silicide material, is a sharp edge that terminates at or near the perimeter of the isolation region. Sharp edge effects generate high electric fields and undue leakage currents that ultimately degrade the performance of the device. Thus, in the present invention, guard rings are fabricated in order to attenuate the electric field generated and reduce the leakage current in this region.

The guard rings referred to here may be of any shape which surround the designated area to provide the necessary isolation. Typically, this area will be square or rectangular in shape, although other shapes are possible.

Figure 2A:
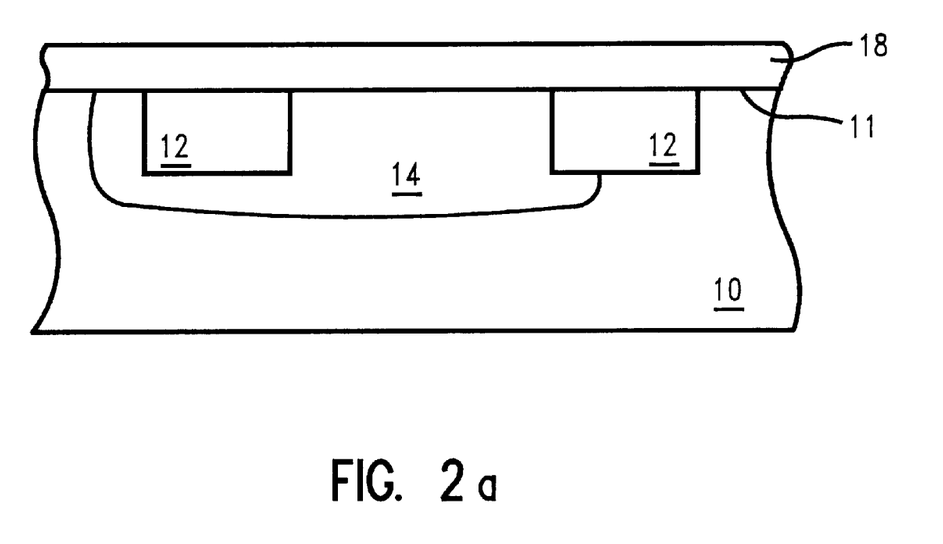
FIG. 2a is a cross-sectional view of the substrate with an added dual tone (frequency-doubling) resist.
Figure 2B:
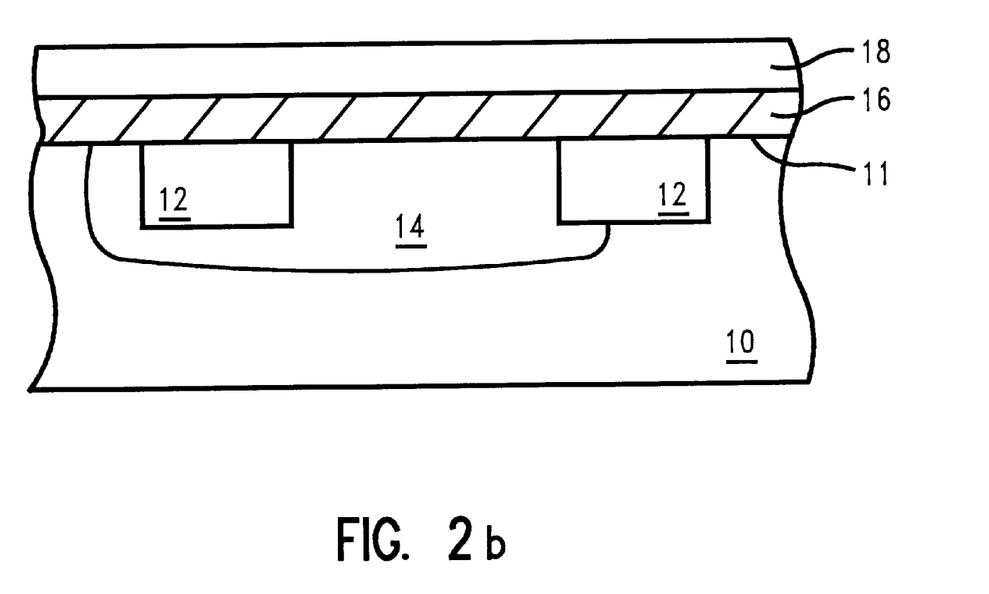
FIG. 2b is a cross-sectional view of the substrate with an applied sacrificial pad in the fabrication process, and an added dual tone (frequency-doubling) resist.

The substrate of FIG. 1 is then coated on surface 11 with a dual tone (frequency-doubling) photoresist 18 on the upper surface of the substrate surface, as shown in FIG. 2a. The frequency-doubling resist is used to provide for sub-lithographic space features on both sides of the inside edges of adjacent isolation structures. Although the preferred invention does not require a sacrificial pad on surface 11 of substrate 10 and STI structure 12, one may elect to fabricate the Schottky diode using a sacrificial pad 16 as depicted in FIG. 2b.

Figure 3:
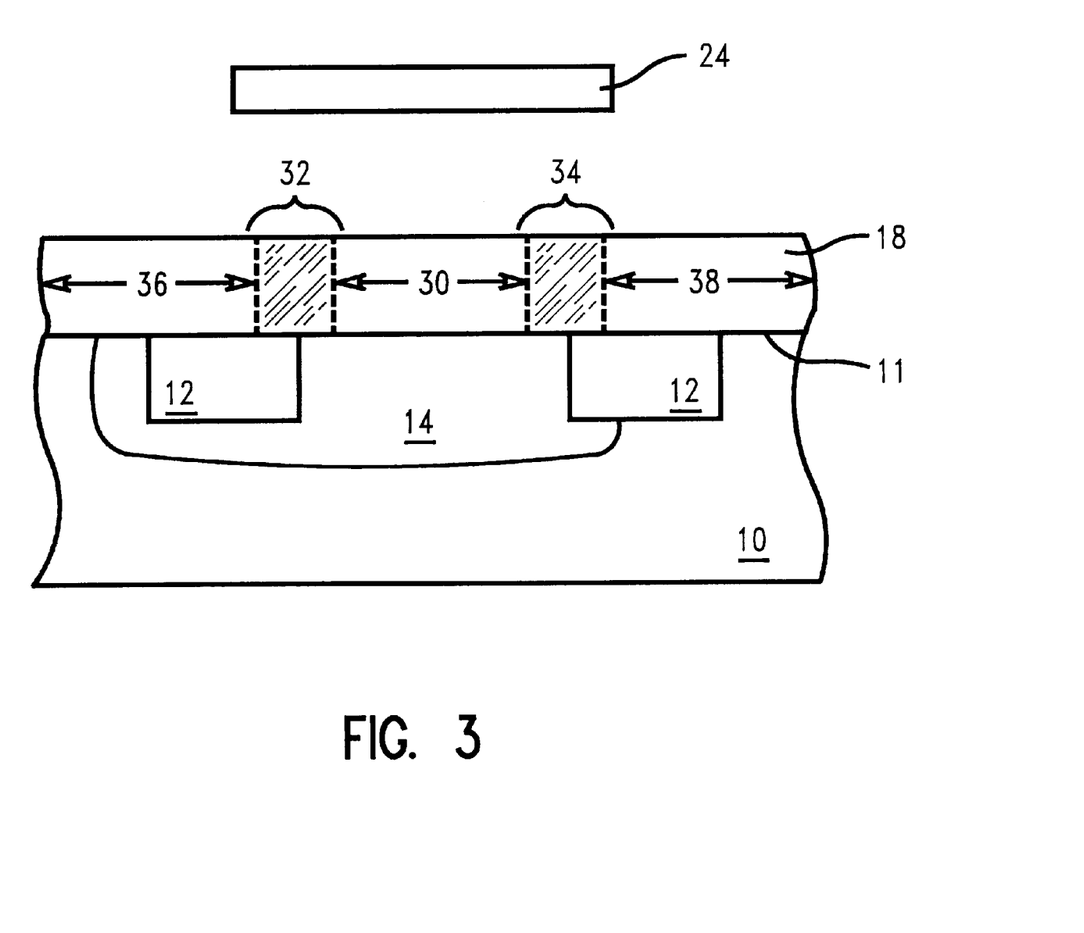
FIG. 3 is a cross-sectional view of the layered substrate with a mask used to prepare the positive and negative tone resist regions.

Referring to FIG. 3, the layered substrate is then exposed and developed with a first mask 24, opaque to the illuminating energy (light) employed. This masking is shown as an opaque portion above the substrate. The mask is utilized to confine the guard ring regions to specific areas on the substrate. These regions are defined by having the mask edges terminate a pre-selected distance within the inside edges of adjacent shallow trench isolation structures and a pre-selected distance outside the inside edges of these isolation structures.

The pre-selected distance to be chosen is affected by the properties of the dual-tone resist and the frequency of the radiation used to expose it. Dual tone resist, also referred to as "frequency doubling resist", is a recently developed type of photoresist, which has the capability of defining three distinct regions during a single exposure. A complete description of dual tone resist is provided in U.S. patent application Ser. No. 08/715,287 filed Sep. 16, 1996, entitled "Frequency Doubling Hybrid Photoresist", to the assignee of the present invention, International Business Machines, Corporation. The disclosure of that application is incorporated herein by reference.

Briefly described, the dual tone resist has three states depending upon the level of illumination it receives during exposure. The levels of exposure are three-fold: 1) an unexposed state; 2) a lightly or partially exposed state; and, 3) an exposed state. Only the partially exposed dual tone resist is removed after exposure and development. Exposed resist and unexposed resist remain on the substrate surface and do not react with the developer.

This three state property is used to provide two advantageous features for the guard rings of the present invention. The first is the production of a sub-minimum width guard ring. The dimensions of the other features on the substrate are controlled by the minimum width of opaque features in the mask used during production. However, the width of the guard ring produced by this method is controlled by the frequency of the light illuminating the mask 24. This frequency affects the diffraction of light off the edges of the opaque portion of the mask. The diffracted light, off the edges of the opaque mask, partially exposes the resist underneath the mask.

The second advantageous feature achieved by the dual tone resist is self-alignment between the guard ring produced and the semiconductor device to be formed within that guard ring. The photoresist is exposed twice and used as a mask twice. In the first use, it is given total exposure in pre-selected areas, and the diffraction off the mask produces a partial exposure in the guard ring region. This partially exposed region is then removed to prepare the mask for ion implantation. In the second use, a light blanket exposure with no mask allows the previously unexposed areas to be removed. This complete method permits a guard ring to be formed with perfect alignment on both sides of the inside edges of adjacent shallow trench isolation structures. It also allows for further ion implantation to be perfectly aligned to the guard rings.

Referring to FIG. 3, the portion of the dual tone resist 18, which underlies the opaque portion of the mask 24, will remain in the dark and unexposed during the first exposure state. This unexposed portion, located between adjacent STI structures, just within the inside edges of the STI structures, is the positive tone region 30 of the resist.

The portions of the photoresist to the left of the left edge of mask 24, and to the right of the right edge of mask 24, directly receive the first exposure and form the negative tone regions 36 and 38 respectively.

Figure 4:
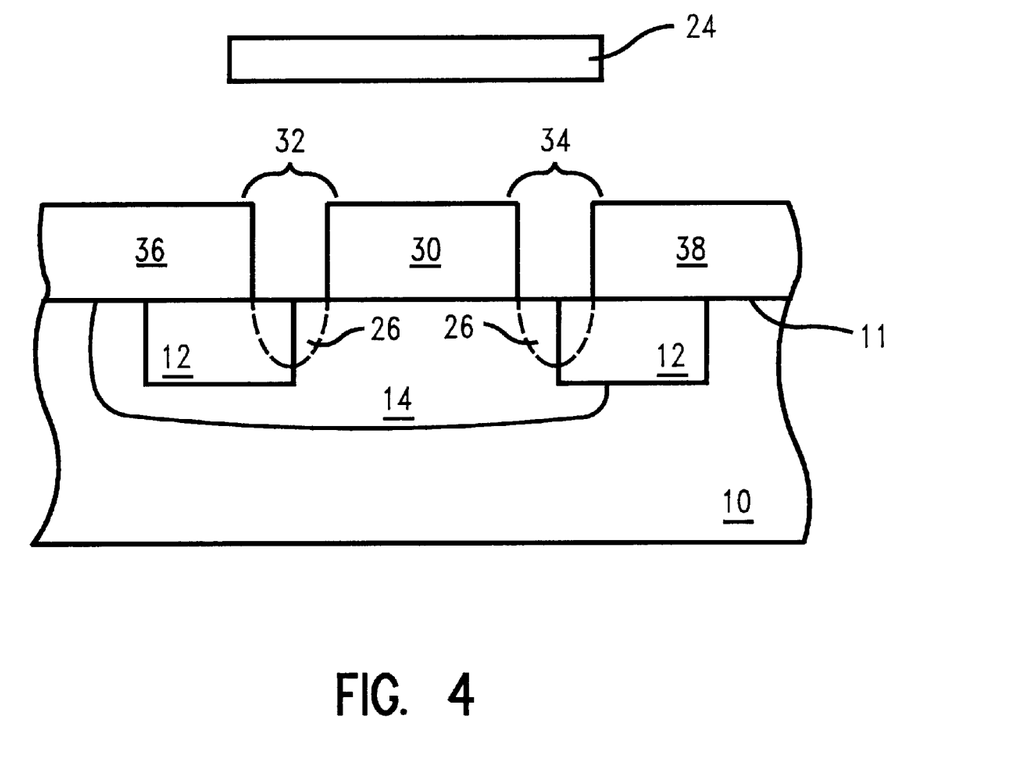
FIG. 4 is a cross-sectional view of the layered substrate depicting the removal of the resist in the region of guard ring implantation.

Transition regions on either side of the positive tone region 30, in areas between the positive tone region and the negative tone regions, depicted in FIG. 4 as between regions 36 and 30, and between regions 38 and 30, and marked with reference numerals 32 and 34 respectively, are partially illuminated by diffracted light off the edges of the mask during the first exposure. The width of these partially illuminated areas is controlled by the frequency of the light illuminating the mask.

These partially illuminated regions, 32 and 34, will be exposed and removed after development of the photoresist. The remaining resist surrounding these partially illuminated, removed regions, forms the mask for ion implantation.

Each transition region 32 and 34, creating a narrowly exposed space for implant, straddles the inside edges of adjacent STI structure boundaries to ensure that in all cases the guard ring is at the perimeter of the STI structure inside edge where it will join with deposited material that ultimately forms the diode structure.

Referring to FIG. 4, guard ring implants 26 are made with the selection of implantation energy so that, when utilized with the prepared resist mask, only the narrow region on both sides of the inside edges of adjacent isolation structures are doped.

After the guard rings are implanted, the unexposed resist region protected from illumination by mask 24 during the first exposure (the positive tone region 30), located between the inside edges of adjacent STI structures, is then blanket exposed, developed, and removed.

Figure 5A:
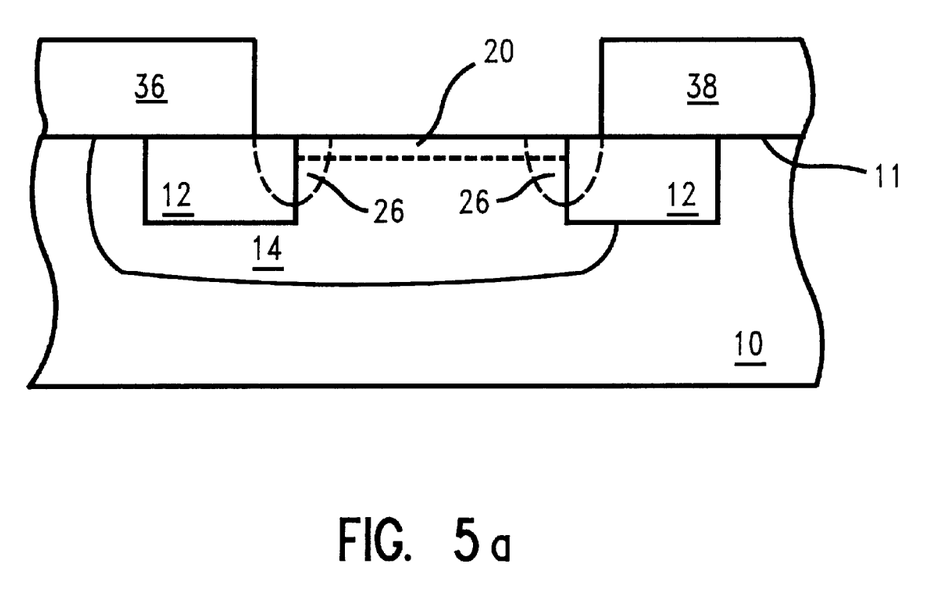
FIG. 5a is a cross-sectional view of the layered substrate with the positive tone resist removed, guard implant layers and ion implant region added.

Referring to FIG. 5a, ion implantation 20 is then performed in this open region to tailor the surface concentration of the diode. This ion implantation may be of a type opposite the original starting substrate, i.e., of the type used for implant well 14, or of the same type as the original starting substrate. It is of a lower dose concentration than that of the implanted guard ring, and of an energy such that it is implanted at a similar depth within the substrate as the guard ring.

If ion implant 20 is of the same type as implant well 14 it will reduce the turn-on voltage of the device. If ion implant 20 is of the type opposite that of implant well 14 it will tend to reduce the reverse bias leakage current.

Figure 5B:
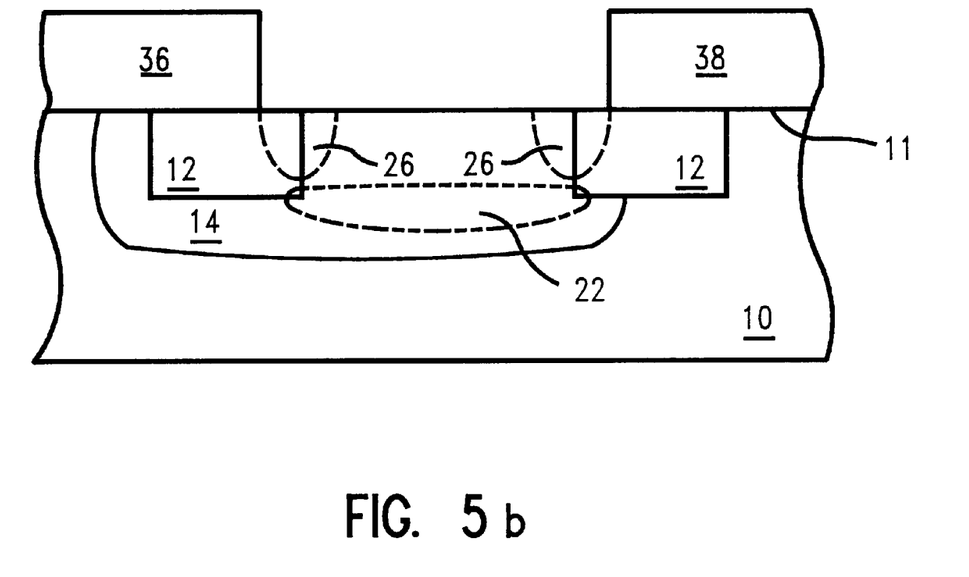
FIG. 5b is a cross-sectional view of the layered substrate with the positive tone resist removed, guard implant layers and ion implant region added.

FIG. 5b depicts an ion implantation 22 at a depth deeper than guard rings 26. Again, this ion implantation may be of a type opposite the original starting substrate; the type used for the implant well 14, or of the same type as the original starting substrate.

If ion implant 22 is of the same type as implant well 14 it will reduce the resistance. However, if ion implant 22 is of the type opposite that of implant well 14 it will tend to reduce the parasitic capacitance and increase the reverse breakdown voltage.

Figure 5C:
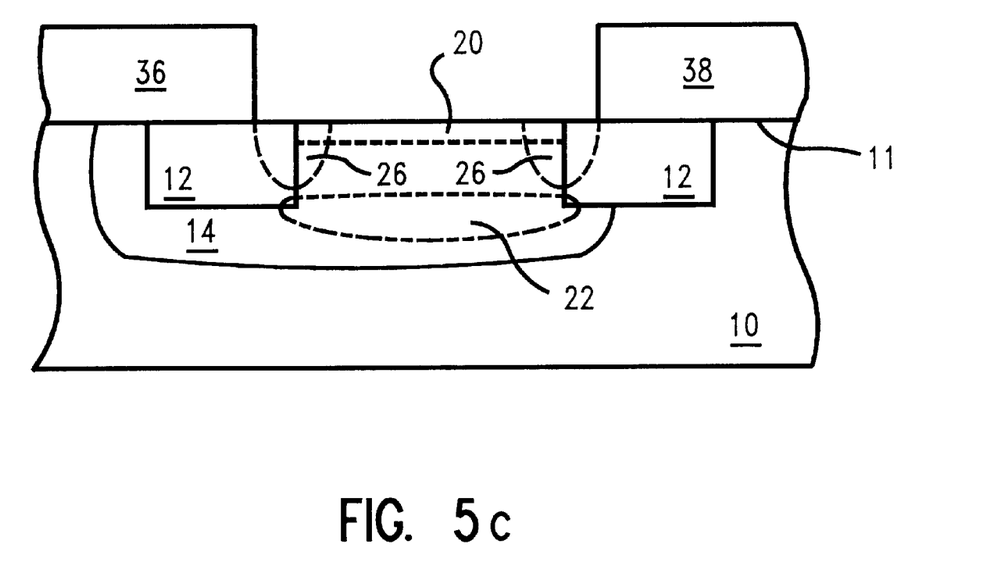
FIG. 5c is a cross-sectional view of the layered substrate with the positive tone resist removed, guard implant layers and both shallow and deep ion implant regions added.

FIG. 5c depicts both ion implants being performed on the same Schottky diode at depths approximately equal to and deeper than the depth of guard rings.

Figure 6:
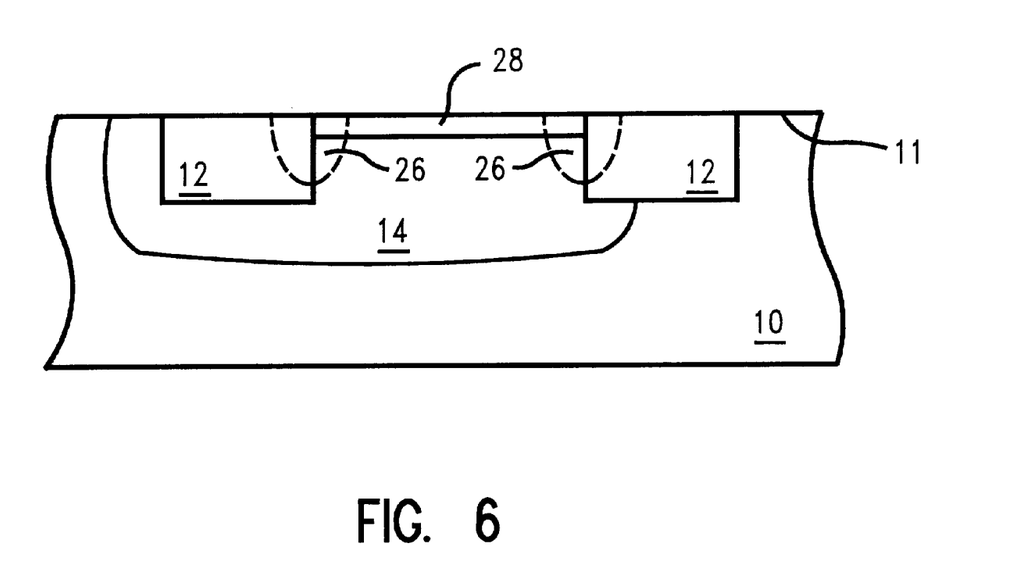
FIG. 6 depicts the layered substrate after a silicide layer has been deposited in the region where the mask and resist have been removed.
Figure 7:
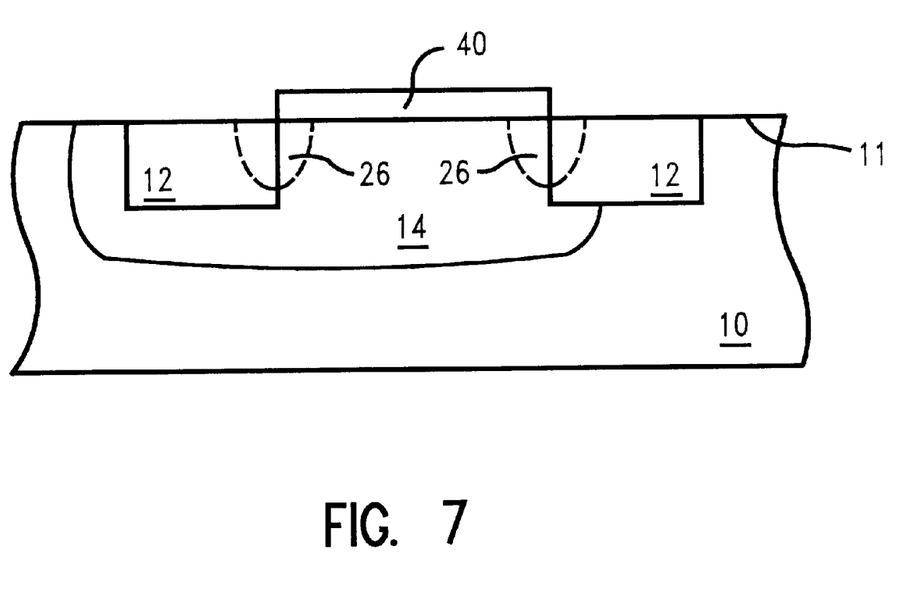
FIG. 7 depicts the layered substrate after a metal layer has been deposited in the region where the mask and resist have been removed.

Once the resist has been stripped, the regions of exposed silicon are deposited with a material to prepare a diode device, typically metal or silicide. FIG. 6 depicts the diode with silicide 28 deposited, while FIG. 7 depicts the diode with metal 40 deposited. The result is a Schottky diode with sub-lithographic guard rings. This represents the final stage of the preferred embodiment of the present invention.

While the present invention has been particularly described, in conjunction with a specific preferred embodiment, it is evident that many alternatives, modifications and variations will be apparent to those skilled in the art in light of the foregoing description. Chief among these is the converse design of a p-type substrate with an n-type guard ring. Also, isolation structures need not be restricted to Shallow Trenches. A sacrificial pad layer may be used in the fabrication process as the first layer on the substrate, although the preferred embodiment does not utilize one. Other configurations will accommodate the present invention. It is therefore contemplated that the appended claims will embrace any such alternatives, modifications and variations as falling within the true scope and spirit of the present invention.

Thus, having described the invention, what is claimed is:

1. A method for preparing a diode with a sublithographic guard ring comprising the steps of:
    a) preparing a substrate having a surface thereof with adjacent isolation structures having inside edges on either side of an n- or p-type implanted region;
    b) applying a resist to said surface of said substrate;
    c) depositing an ion of type opposite to said implanted region in said substrate on both sides of said inside edges of said adjacent isolation structures to create said sublithographic guard ring on the sides of said inside edges of said adjacent isolation structures;
    d) removing said resist to expose said substrate between said inside edges of said adjacent isolation structures; and
    e) applying a material to the exposed substrate between said isolation structures to prepare a diode device.

2. The method of claim 1 wherein said step (a) comprises preparing shallow trench isolation structures.

3. The method of claim 1 wherein said step of applying a resist to said surface of said substrate comprises forming a sacrificial pad layer on said surface of said substrate and then applying a resist to said surface of said substrate.

4. The method of claim 1, wherein said step of applying a resist to said substrate, and said step of implanting said sublithographic guard ring, comprise the steps of:
    (i) applying a resist over said substrate;
    (ii) exposing and developing said resist so as to remove portions of said resist above both sides of said inside edges of said adjacent isolation structures to produce said sublithographic guard ring; and,
    (iii) implanting an ion of type opposite to said implanted region in said substrate on both sides of said inside edges of said adjacent isolation structures to create said sublithographic guard ring using remaining portions of said resist as a mask.

5. The method of claim 1 wherein said step of applying a material to the exposed substrate further comprises p- or n-type ion implantation at a depth approximately equal to depth of said guard ring.

6. The method of claim 1 wherein said step of applying a material to the exposed substrate further comprises p- or n-type ion implantation at a depth deeper than depth of said guard ring.

7. The method of claim 1 wherein said step of applying a material to the exposed substrate further comprises p- or n-type ion implants at a depth deeper than depth of said guard ring, and at a depth approximately equal to depth of said guard ring.

8. The method of claim 3 wherein said step of removing said resist comprises removing said sacrificial pad layer and said resist to expose said substrate between said inside edges of said adjacent isolation structures.

9. The method of claim 4, wherein said step of applying a resist over said substrate comprises applying a layer of dual tone resist over said substrate; and, wherein said step of exposing and developing said resist comprises exposing said dual tone resist using a mask such that:
    (iv) a portion of said resist between said adjacent isolation structures remains unexposed;
    (v) portions of said resist over said adjacent isolation structures outside said inside edges of said adjacent isolation structures are completely exposed; and,
    (vi) portions of the resist over both sides of said inside edges of said adjacent isolation structures are partially exposed; and
    further comprises removing said partially exposed resist from said substrate to provide for said sublithographic guard ring.

10. The method of claim 9, further comprising the steps of:
    (vii) implanting a guard ring by forming a doped semiconductor region with an ion implant of type opposite said implanted region, over both sides of said inside edges of said isolation regions, using the remaining resist as a second mask for said implant;
    (viii) exposing and developing said unexposed portion of remaining resist regions from said substrate prepared during the exposing step (iv); and
    (ix) preparing a second mask for implantation by removing said resist portion exposed and developed in step (viii), above.

11. The method of claim 10 wherein said step of applying a material to the exposed substrate further comprises p- or n-type ion implantation at a depth approximately equal to depth of said guard ring.

12. The method of claim 10 wherein said step of applying a material to the exposed substrate further comprises p- or n-type ion implantation at a depth deeper than depth of said guard ring.

13. The method of claim 10 wherein said step of applying a material to the exposed substrate further comprises p- or n-type ion implants at a depth deeper than depth of said guard ring, and at a depth approximately equal to depth of said guard ring.

14. The method of claim 4, wherein said step of exposing and developing said resist comprises exposing said resist using a mask such that:
    (x) using a pre-selected exposing light frequency, a portion of said resist a pre-selected distance between said adjacent isolation structures remains unexposed;

(xi) using said pre-selected exposing light frequency, portions of said resist over said adjacent isolation structures a pre-selected distance outside said inside edges of said adjacent isolation structures are completely exposed; and, (xii) using said pre-selected exposing light frequency, portions of the resist a pre-selected distance over both sides of said inside edges of said adjacent isolation structures are of sublithographic dimensions and partially exposed; and further comprises removing said partially exposed resist from said substrate.

15. The method of claim 14, further comprising the steps of:

(xiii) implanting a guard ring by forming a doped semiconductor region with an implant of type opposite said implanted region, over both sides of said inside edges of said isolation regions, using the remaining resist as a second mask for said implant;

(xiv) exposing and developing said unexposed portion of remaining resist regions from said substrate during the exposing step (x); and (xv) preparing a second mask for implantation by removing said resist portion exposed and developed in step (xiv), above.

16. The method of claim 15 wherein said step of applying a material to the exposed substrate further comprises p- or n-type ion implantation at a depth approximately equal to depth of said guard ring.

17. The method of claim 15 wherein said step of applying a material to the exposed substrate further comprises p- or n-type ion implantation at a depth deeper than depth of said guard ring.

18. The method of claim 15 wherein said step of applying a material to the exposed substrate further comprises p- or n-type ion implants at a depth deeper than depth of said guard ring, and at a depth approximately equal to depth of said guard ring.

19. A method for preparing a sublithographic guard ring on a semiconductor substrate comprising the steps of:

a) preparing a substrate having a surface thereof with adjacent isolation structures having inside edges on either side of an n- or p-type implanted region;

b) applying a dual tone resist to said substrate;

c) exposing and developing said resist so as to remove portions of said resist above both sides of said inside edges of said adjacent isolation structures such that:

i) a portion of said resist between said adjacent isolation structures remains unexposed;

ii) portions of said resist over said adjacent isolation structures outside said inside edges of said adjacent isolation structures are completely exposed; and iii) portions of the resist over both sides of said inside edges of said adjacent isolation structures are partially exposed to provide for said sublithographic guard ring; and d) implanting said sublithographic guard ring by forming a doped semiconductor region with an implant of type opposite said implanted region, over both sides of said inside edges of said isolation regions, using the remaining resist as a second mask for said implant.

20. The method of claim 19 wherein said step (a) comprises preparing shallow trench isolation structures.

21. The method of claim 19 wherein said step of applying a resist to said surface of said substrate comprises forming a sacrificial pad layer on said surface of said substrate and then applying a resist to said surface of said substrate.

22. The method of claim 19 wherein said step of applying a material to the exposed substrate further comprises p- or n-type ion implantation at a depth approximately equal to depth of said guard ring.

23. The method of claim 19 wherein said step of applying a material to the exposed substrate further comprises p- or n-type ion implantation at a depth deeper than depth of said guard ring.

24. The method of claim 19 wherein said step of applying a material to the exposed substrate further comprises p- or n-type ion implants at a depth deeper than depth of said guard ring, and at a depth approximately equal to depth of said guard ring.

25. A method for preparing a diode with a sublithographic guard ring comprising the steps of:

a) preparing a substrate having a surface thereof with adjacent isolation structures having inside edges on either side of an n- or p-type implanted region;

b) applying a hybrid dual tone resist to said surface of said substrate wherein said resist is capable of partial exposure;

c) partially exposing preselected portions of said resist using diffracted light off said inside edges to form spaces on the sides of said inside edges of said adjacent isolation structures to provide for said sublithographic guard ring;

d) implanting an ion of type opposite to said implanted region in said substrate on both sides of said inside edges of said adjacent isolation structures to form said sublithographic guard ring;

e) removing the partially exposed resist to expose said substrate between said inside edges of said adjacent isolation structures; and f) applying a material to the exposed substrate between said isolation structures to prepare a diode device.

26. A method for preparing a sublithographic guard ring on a semiconductor substrate comprising the steps of:

a) preparing a substrate having a surface thereof with adjacent isolation structures having inside edges on either side of an n- or p-type implanted region;

b) applying a hybrid dual tone resist to said substrate wherein said resist is capable of partial exposure;

c) exposing and developing said resist so as to remove portions of said resist above both sides of said inside edges of said adjacent isolation structures such that:

i) a portion of said resist between said adjacent isolation structures remains unexposed;

ii) portions of said resist over said adjacent isolation structures outside said inside edges of said adjacent isolation structures are completely exposed; and iii) portions of the resist over both sides of said inside edges of said adjacent isolation structures are partially exposed using diffracted light off said inside edges to outline said sublithographic guard ring; and d) implanting an ion with an implant of type opposite said implanted region over both sides of said inside edges of said isolation regions to form a doped semiconductor region as said guard ring, using the remaining resist as a second mask for said implant.

27. A method for preparing a diode with a sublithographic guard ring comprising the steps of:

a) preparing a substrate having a surface thereof with adjacent isolation structures having inside edges on either side of an n- or p-type implanted region;

b) applying a resist to said surface of said substrate by first forming a sacrificial pad layer on said surface of said substrate, and then applying said resist to said surface of said substrate;

c) depositing an ion of type opposite to said implanted region in said substrate on both sides of said inside edges of said adjacent isolation structures to create said sublithographic guard ring on the sides of said inside edges of said adjacent isolation structures;

d) removing said resist to expose said substrate between said inside edges of said adjacent isolation structures; and e) applying a material to the exposed substrate between said isolation structures to prepare a diode device.

28. A method for preparing a diode with a sublithographic guard ring comprising the steps of:

a) preparing a substrate having a surface thereof with adjacent isolation structures having inside edges on either side of an n- or p-type implanted region;

b) applying a resist to said surface of said substrate by first forming a sacrificial pad layer on said surface of said substrate, and then applying said resist to said surface of said substrate;

c) depositing an ion of type opposite to said implanted region in said substrate on both sides of said inside edges of said adjacent isolation structures to create said sublithographic guard ring on the sides of said inside edges of said adjacent isolation structures;

d) removing said resist by first removing a sacrificial pad layer and then said resist to expose said substrate between said inside edges of said adjacent isolation structures; and e) applying a material to the exposed substrate between said isolation structures to prepare a diode device.

29. A method for preparing a sublithographic guard ring on a semiconductor substrate comprising the steps of:

a) preparing a substrate having a surface thereof with adjacent isolation structures having inside edges on either side of an n- or p-type implanted region;

b) applying a dual tone resist to said substrate by forming a sacrificial pad layer on said surface of said substrate and then applying said resist to said surface of said substrate;

c) exposing and developing said resist so as to remove portions of said resist above both sides of said inside edges of said adjacent isolation structures such that:

i) a portion of said resist between said adjacent isolation structures remains unexposed;

ii) portions of said resist over said adjacent isolation structures outside said inside edges of said adjacent isolation structures are completely exposed; and iii) portions of the resist over both sides of said inside edges of said adjacent isolation structures are partially exposed to provide for said guard ring; and, d) implanting said guard ring by forming a doped semiconductor region with an implant of type opposite said implanted region, over both sides of said inside edges of said isolation regions, using the remaining resist as a second mask for said implant.

* * * * *